US 8,841,562 B2

(12) United States Patent
Drotleff et al.

(10) Patent No.: US 8,841,562 B2
(45) Date of Patent: Sep. 23, 2014

(54) CABLE FEEDTHROUGH

(75) Inventors: Rolf Drotleff, Deckenpfronn (DE);
Daniel Mueller, Remseck (DE)

(73) Assignee: Lapp Engineering & Co., Stuttgart (DE)

( * ) Notice: Subject to any disclaimer, the term of this patent is extended or adjusted under 35 U.S.C. 154(b) by 220 days.

(21) Appl. No.: 13/353,753

(22) Filed: Jan. 19, 2012

(65) Prior Publication Data
US 2012/0211274 A1 Aug. 23, 2012

(30) Foreign Application Priority Data

Jan. 24, 2011 (DE) .......................... 10 2011 003 071

(51) Int. Cl.
 *H01R 13/648* (2006.01)
 *H02G 3/06* (2006.01)
 *H05K 9/00* (2006.01)
(52) U.S. Cl.
 CPC ........... *H02G 3/0666* (2013.01); *H05K 9/0018* (2013.01); *H02G 3/0675* (2013.01)
 USPC ...................................................... 174/360
(58) Field of Classification Search
 CPC .................................................. H01R 13/648
 USPC ....................................................... 174/360
 See application file for complete search history.

(56) References Cited

U.S. PATENT DOCUMENTS

| 5,821,868 | A  | * | 10/1998 | Kuhling ...................... 340/649 |
| 5,942,730 | A  | * | 8/1999  | Schwarz et al. ............ 174/84 R |
| 6,105,247 | A  | * | 8/2000  | Varreng ........................ 29/871 |
| 6,335,488 | B1 |   | 1/2002  | Gretz |
| 6,776,657 | B1 | * | 8/2004  | Hung ............................ 439/578 |
| 7,635,816 | B1 |   | 12/2009 | Shemtov |
| 7,790,989 | B2 | * | 9/2010  | Delakowitz .................. 174/669 |
| 2007/0248434 | A1 | * | 10/2007 | Wiley et al. .................. 411/160 |
| 2008/0073102 | A1 | * | 3/2008  | Mueller et al. .................. 174/78 |

FOREIGN PATENT DOCUMENTS

| DE | 102008019165 A1 | 11/2009 |
| EP | 1710880 A1 | 10/2006 |
| GB | 2450519 A | 12/2008 |

* cited by examiner

Primary Examiner — Timothy Thompson
Assistant Examiner — Charles Pizzuto
(74) Attorney, Agent, or Firm — Reinhart Boerner Van Deuren s.c.

(57) ABSTRACT

In order to improve a cable feedthrough comprising a housing connection piece, a cable fixing device provided on the housing connection piece, a fastening section which is provided in the housing connection piece and with which the housing connection piece can be secured to a wall section of an appliance, and a shield contact element which makes contact with a cable shield of a cable guided through the cable feedthrough, in such a manner that it is possible for the shield contact element to make reliable contact with the wall section, it is suggested that the shield contact element be fixable to the fastening section with a holding element and that the shield contact element make contact with the cable shield or with the wall section of the appliance with at least one housing contact element which is designed to dig into the wall section.

23 Claims, 18 Drawing Sheets

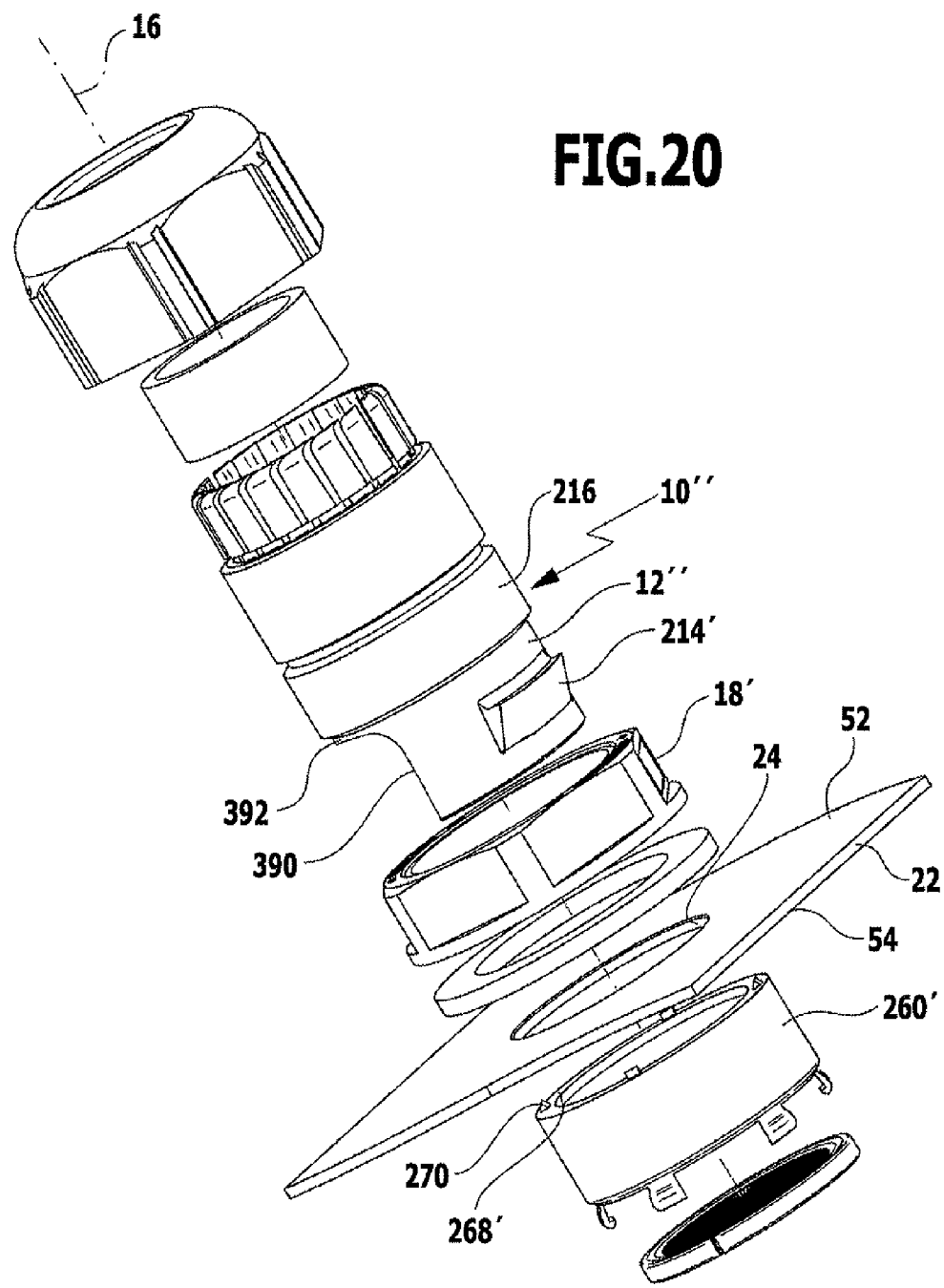

CABLE FEEDTHROUGH

This patent application claims the benefit of German application No. 10 2011 003 071.9, filed Jan. 24, 2011, the teachings and disclosure of which are hereby incorporated in their entirety by reference thereto.

The invention relates to a cable feedthrough comprising a housing connection piece, a cable fixing device provided on the housing connection piece, a fastening section which is provided in the housing connection piece and with which the housing connection piece can be secured to a wall section of an appliance and a shield contact element which makes contact with a cable shield of a cable guided through the cable feedthrough.

Cable feedthroughs of this type are known from the state of the art.

The problem with them is, however, that the shield contact element does not provide a reliable contact with the wall section of the appliance.

The object underlying the invention is, therefore, to improve a cable feedthrough of the generic type in such a manner that it is possible for the shield contact element to make reliable contact with the wall section.

This object is accomplished in accordance with the invention, in a cable feedthrough of the type described at the outset, in that the shield contact element can be fixed to the fastening section with a holding element and that the shield contact element makes contact with the cable shield, on the one hand, and, on the other hand, makes electrical contact with the wall section of the appliance with at least one housing contact element which is designed to dig into the wall section.

The advantage of the solution according to the invention is to be seen in the fact that it is possible as a result of such a housing contact element to ensure electrical contact with the wall section by the shield contact element even in the case of surface corrosion or surface coating of the wall section.

With respect to the arrangement of the housing contact elements, the most varied of possibilities are conceivable.

In principle, the housing contact elements can be arranged on optional parts of the shield contact elements.

One particularly preferred solution provides for the at least one housing contact element to be designed as a projection provided on the holding element.

In this case, it is particularly simple to arrange the projection such that it can dig into the wall section.

In order to ensure that it can dig into the wall section, it is preferably provided for the projection to have a sharp-edged contour which faces the wall section and with which the projection is able to dig into the surface of the wall section.

Such a sharp-edged contour can be realized, for example, by means of a point or a cutting edge.

It would, however, also be conceivable to provide several projections or also several sharp-edged contours per projection.

In order to offer the possibility of the sharp contour digging into the surface of the housing connection piece when the shield contact element is placed on the fastening section, the sharp contour is designed such that it moves on a path around the central axis of the housing connection piece during movement of the projection and digs into the surface of the wall section.

Such movement of the sharp contour around the central axis of the housing connection piece can be realized in a simple manner in that the shield contact element is turned relative to the housing connection piece or, in particular, relative to the fastening section of the housing connection piece.

Such turning is brought about, for example, automatically in the case of a screw connection between the shield contact element and the fastening element.

In the case of a connection of a different design between the fastening section and the shield contact element, it is provided for this to be designed such that turning of the shield contact element relative to the fastening section can be brought about.

With respect to the fixing of the shield contact element to the fastening section, the most varied of possibilities are conceivable.

One conceivable possibility would be to fix the shield contact element to the fastening section in a force locking manner, i.e. by way of friction or clamping.

A particularly secure fixing of the shield contact element to the fastening section is preferably brought about in that the shield contact element is connected to the fastening section in a form locking manner and can, therefore, be fixed to it in a form locking manner.

Such a fixability may be realized in accordance with the invention in a particularly simple manner when the shield contact element has an annular member which engages around the fastening section of the housing connection piece.

Alternatively or in addition thereto, it is, however, also of advantage when the shield contact element has a sleeve member which surrounds the fastening section.

If, for example, both an annular member and a sleeve member are provided, one advantageous solution provides for the annular member and the sleeve member to be connected to one another, in particular be integrally formed on one another.

The fixing of the shield contact element to the fastening section may be realized, in particular, in that the holding element can be fixed to the fastening section by a screw connection.

Alternatively thereto, it is, however, also conceivable for the holding element to be fixed to the fastening section by means of a form locking element engaging in behind it.

This may be realized, for example, in that the shield contact element can be fixed in place by way of engagement between a supporting element of the fastening section and the wall section.

With respect to the material of the housing connection piece, no further details have so far been given.

In principle, the housing connection piece could consist of an electrically conductive material.

For reasons of cost, it has now proven to be particularly advantageous when the housing connection piece is formed from an electrically non-conducting material since, as a result, the cable can be fixed in place inexpensively and in a simple manner but electrical conductivity of the housing connection piece is not necessary on account of the special design of the shield contact element.

The housing connection piece could consist of various, electrically non-conducting materials.

One particularly advantageous and inexpensive solution provides for the housing connection piece to consist of plastic.

With respect to the design of the shield contact element, no further details have so far been given.

One particularly favorable solution provides for the shield contact element to have an electrically conducting surface.

The electrically conducting surface can be arranged on an electrically non-conducting base member.

Another advantageous solution provides for the shield contact element to be formed from an electrically conducting material in order to be able to realize the provision of an electrically conducting connection between the cable shield and the wall section.

With respect to the design of the shield contact element with a view to making contact with the cable shield, no further details have so far been given.

The most varied of possibilities for making contact with the cable shield are conceivable.

One advantageous solution provides for the shield contact element to have a bristle element for making contact with the cable shield.

It is provided, in particular, in the case of such a bristle element for this to be designed as a bristle ring which has electrically conducting bristles which extend transversely to the direction of the central axis of the housing connection piece.

The bristles can be arranged, for example, so as to lie in a spherical surface.

It is particularly favorable when the bristles extend approximately radially, i.e. in an angular range of between 80° and 100°, in relation to the central axis.

In this respect, the bristle element is preferably connected to the holding element of the shield contact element in order to position the bristle element accordingly.

Alternatively or in addition to providing a bristle element, an additional advantageous solution provides for the shield contact element to comprise cable shield clamping elements, by means of which it is possible to securely clamp individual wires of the cable shield to the shield contact element.

Such cable shield clamping elements are preferably designed such that they enable clamping of the wires of the cable shield to the sleeve member of the shield contact element.

Alternatively or in addition to providing bristle elements or cable shield clamping elements, an additional advantageous solution of the cable feedthrough according to the invention provides for the shield contact element to have contact bridges for making electrical contact with the cable shield.

Such contact bridges can be designed in the most varied of ways.

One advantageous solution provides for the contact bridges to be connected mechanically to the holding element, in particular also be connected in an electrically conducting manner.

Furthermore, it is preferably provided for the contact bridges to comprise clamping arms which can be moved radially to the central axis of the housing connection piece in a spring-like manner for making electrical contact with the cable shield.

In this respect, it is particularly favorable when the shield contact element has clamping arms or clamping sections which clamp the cable shield in a scissors-like manner.

As a result of such a scissors-like clamping of the cable shield by the clamping arms, the shield contact element can realize a reliable electrical contact with the cable shield.

With respect to the design of the contact bridges, no further details have been given in conjunction with the preceding comments on the individual embodiments. One advantageous solution, for example, provides for the shield contact element to have at least two contact bridges which have a spring element on a first side of the cable shield and act on the cable shield with a contact surface on a second oppositely located side of the cable shield.

Such a design of the contact bridges may be realized, in particular, in a constructionally simple manner when the contact bridges have superposed openings for feeding through the cable with the cable shield and they are acted upon in a spring elastic manner with a view to reducing an overlapping surface area of the openings.

As a result, such a scissors-like clamping of the cable shield can be realized in a simple manner.

This may be realized in a constructionally simple manner, in particular, in that the contact bridges act on the cable shield with an edge section of the respective openings.

Such a clamping of the cable shield by the contact bridges may be realized in a constructionally simple manner when the contact bridges have clamping arms which extend approximately parallel to a surface running transversely to the central axis of the housing connection piece.

An alternative solution to the preceding design of the contact bridges provides for the contact bridges making contact with the cable shield to extend into a central opening in the fastening section.

In this respect, the contact bridges preferably have contact arms which are curved in the direction of a central axis of the fastening element and make the contact with the cable shield.

In this respect, the contact bridges are designed such that they engage around the end surface of the fastening section proceeding from the holding section in order to be able to engage in the central opening.

The contact bridges can lead to contact being made with the cable shield in the entire housing connection piece.

In this respect, it is particularly favorable when the contact bridges are located within the fastening element with their shield contact surfaces which make contact with the cable shield.

Additional features and advantages of the solution according to the invention are the subject matter of the following description as well as the drawings illustrating several embodiments.

In the drawings:

FIG. 19 shows a perspective view of a thirteenth embodiment of a cable feedthrough according to the invention and FIG. 20 shows an exploded illustration of a fourteenth embodiment of a cable feedthrough according to the invention.

Figure 1:
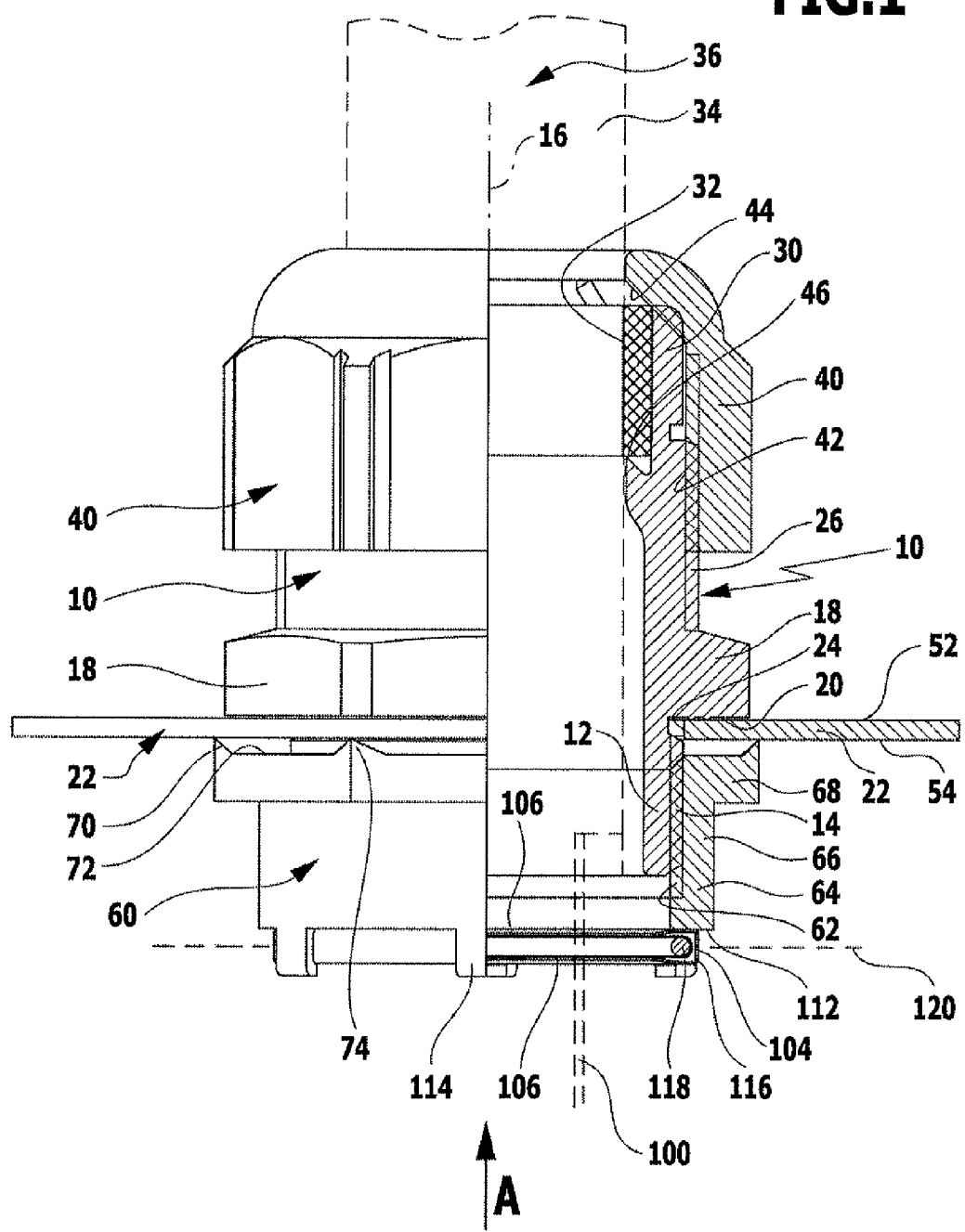
FIG. 1 shows a partially cutaway view of a first embodiment of a cable feedthrough according to the invention with a shield contact element.

A first embodiment of a cable feedthrough according to the invention, illustrated in FIG. 1, comprises a housing connection piece which is designated as a whole as 10 and has at one end a fastening section 12 which bears an outer thread 14. The fastening section 12 is adjoined by a pressure collar 18 which projects beyond the fastening section 12 radially to a central axis 16 of the housing connection piece 10 and bears a pressure surface 20 which faces the fastening section 12 and with which the pressure collar 18 can abut on a wall section 22 of an appliance when the fastening section 12 is guided through an opening 24 in the wall section 22.

On a side of the pressure collar 18 located opposite the fastening section 12 the housing connection piece 10 comprises an additional outer thread 26 and forms a fin basket 30 on a side of the outer thread 26 located opposite the pressure collar 18.

The fin basket 30, for its part, surrounds a ring seal 32 which can abut on a sheath 34 of a cable 36 guided through the cable feedthrough when the fin basket 30 is acted upon in the direction of the central axis 16.

For the purpose of acting on the fin basket 30, a cap nut designated as a whole as 40 is provided and this can be screwed with an inner thread 42 onto the outer thread 26, engages over the fin basket 30 and has a conical pressure surface 44, with which the fin basket 30 can be acted upon in the direction of the central axis 16 when the cap nut 40 is screwed with the inner thread 42 onto the outer thread 26 in order to abut the ring seal 32 on the sheath 34 of the cable 36.

Furthermore, the housing connection piece 10 comprises a sealing edge 46, against which the ring seal 32 can likewise abut in order to obtain a sealed closure, on the one hand, in relation to the housing connection piece 10 and, on the other hand, in relation to the sheath 34 of the cable 36.

In order to abut the pressure collar 18 on a first side 52 of the wall section 22 and keep it in abutment, the fastening section 12 of the housing connection piece 10 is guided through the opening 24 from the first side 52 in the direction of a second side 54 so that the outer thread 14 of the fastening section 12 projects beyond the second side 54 of the wall section 22.

In order to fix the fastening section 12 in place, a shield contact element 60 can be fixed to it and this comprises a holding element 64 which can be screwed onto the outer thread 14 with an inner thread 62 and, for its part, comprises a sleeve member 66 and an annular member 68 which is integrally formed on the sleeve member 66, these two members being provided with the inner thread 62, wherein in this embodiment the annular member 68 is arranged on the side of the sleeve member 66 facing the pressure collar 18 and bears several housing contact elements 70 of the shield contact element.

The housing contact elements 70 extend from an end side 72 of the annular member 68, which faces the pressure collar 18 and, therefore, also the wall section 22, in the direction of the pressure collar 18 or the wall area 22 in the form of projections 74 which each have a point 76 which faces the wall area 22 and is designed such that it is in a position to dig into the side 54 of the wall section 22 which faces the housing contact element 70.

The projections 74 preferably have, in this embodiment, the shape of pyramid-like members which rise from the end side 72 and have outer sides 82 and 84 which extend towards the point 76 as well as an inner side 86 which extends at an angle to the end side 72 in the direction of the point 76.

If, for example, the annular member 68 is provided with an outer polygonal portion 78, the projections 70 are arranged such that the points 76 are arranged as extensions of edges 92 of the polygonal portion 78 and the outer surfaces 82 and 84 represent continuations of the two surfaces 94 of the polygonal portion which meet at the edge 92.

When the shield contact element 60 is screwed with the holding element 64 onto the outer thread 14 of the fastening section 12, the projections 74 move, as a result, on a circular path around the central axis 16 and dig in when they touch the second side 54 of the wall section 22 for such a time during the course of their movement along the circular path around the central axis 16 until the pressure collar 18 of the housing connection piece 10 abuts on the first side 52 of the wall section 22 in a force locking manner such that the wall section 22 is clamped between, on the one hand, the pressure collar and, on the other hand, the projections 74 and, therefore, the cable feedthrough is fixed securely in place on the wall section 22.

The projections 74 have, on the one hand, the effect that they prevent any rotatability of the annular member 68 and the sleeve member 66 around the central axis 16 on account of them digging into the second side 54 of the wall section 22 and the force and/or form locking resulting thereby and, therefore, also see to it that the shield contact element 60 remains essentially fixed in place non-rotatably relative to the wall section 22 in the tightened state and so the cable feedthrough according to the invention can be fixed permanently in place on the wall section 22 as a result. Moreover, the projections 74 have the advantage that they provide a good electrically conducting connection between the projections 74 and, therefore, the housing contact elements 70 and the wall section 22 on account of the fact that they dig into the side 54 of the wall section 22.

As a result, a permanent and good electrically conducting connection between the wall section 22 and the shield contact element 70 can be realized automatically during assembly of the cable screw device according to the invention.

In order to make contact with a cable shield 100 lying beneath the sheath 34 of the cable 36, the sheath 34 of the cable 36 guided through the cable feedthrough according to the invention is removed in a section of the cable 36 which projects beyond the fastening section 12 in the direction of the central axis 16 so that the cable shield 100 is exposed.

Figure 2:
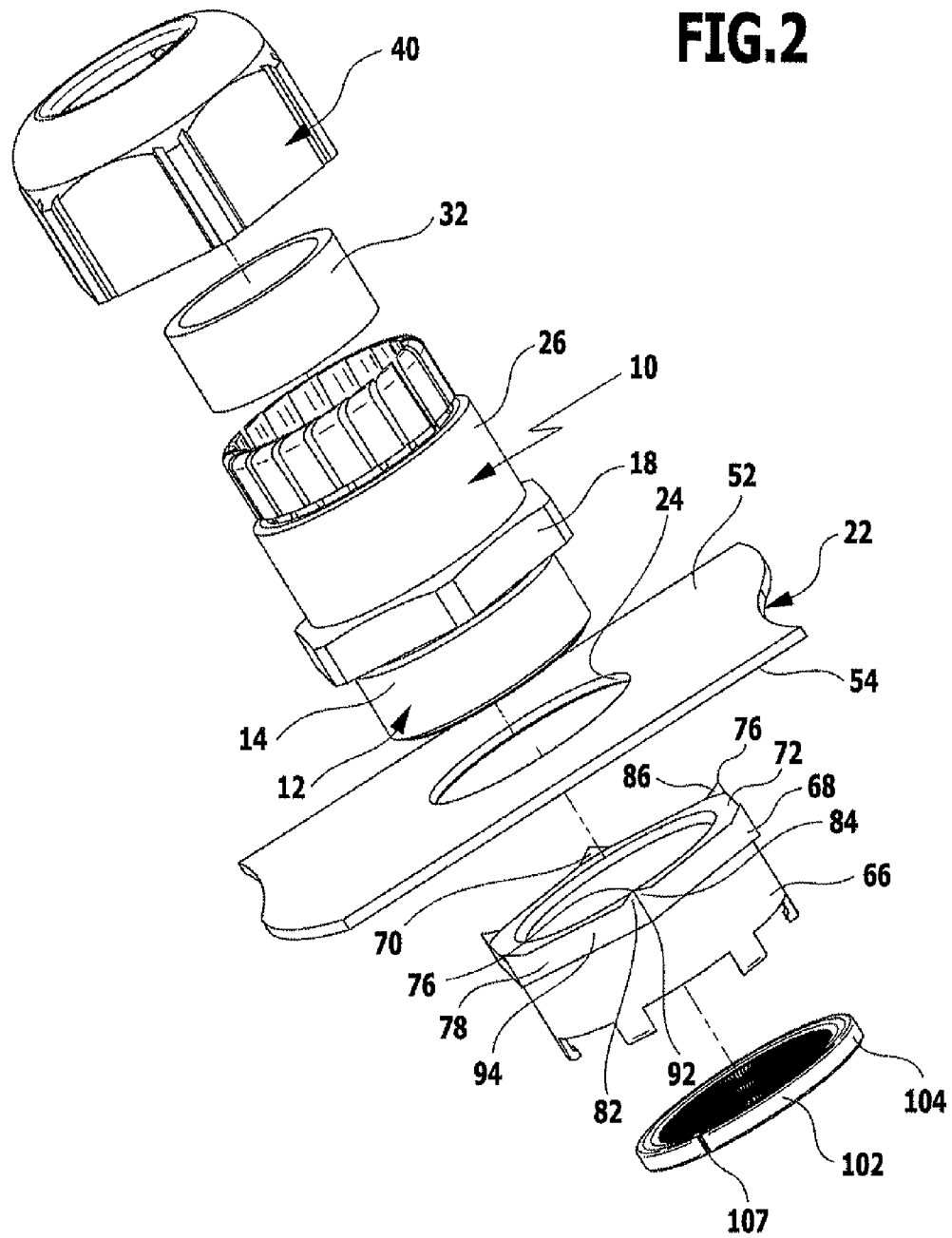
FIG. 2 shows a perspective exploded illustration of the first embodiment
Figure 3:
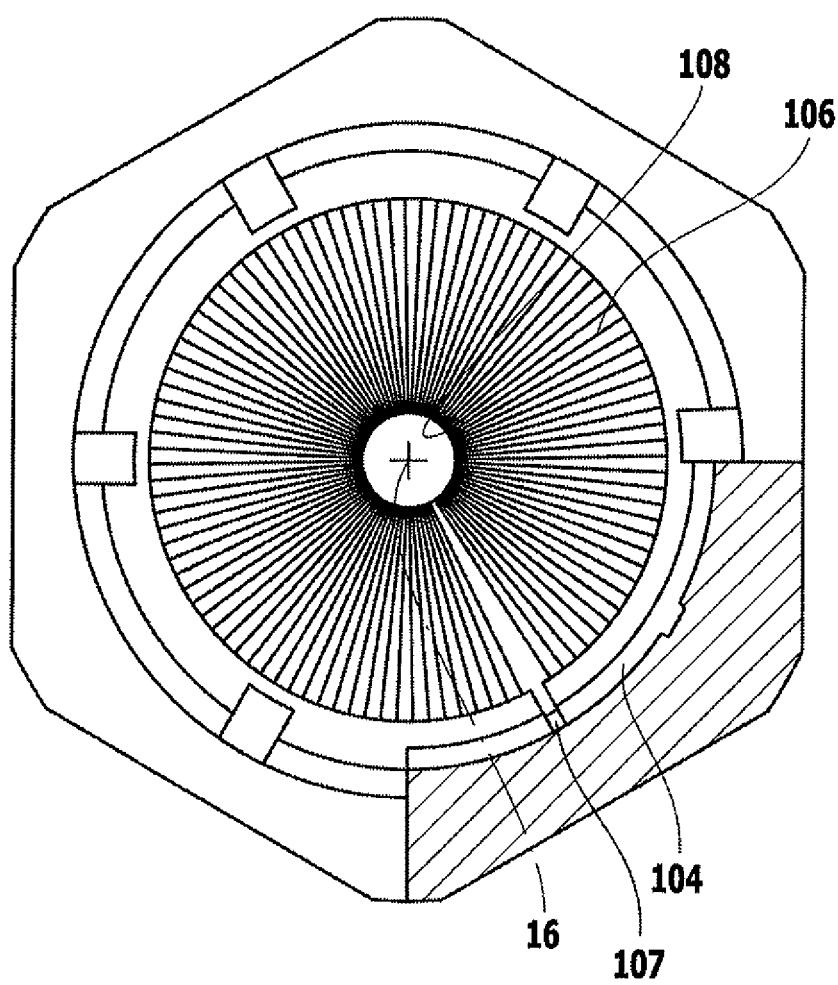
FIG. 3 shows a plan view of the first embodiment of the cable feedthrough according to the invention, viewed in the direction of arrow A in FIG. 1.

Contact is made with the cable shield 100, as illustrated in FIGS. 1 to 3, by a bristle element 102 which has a ring-shaped outer member 104, from which individual bristles 106 extend in the direction towards the central axis 16 and, with their inner ends 108, are at a distance from the central axis 16 which is smaller than a radius of the cable shield 100 exposed on the cable 36 and so when the cable 36 is pushed through the bristle element 102 with the exposed cable shield 100 the plurality of individual bristles 106, which are, for their part, connected to the outer member 104 in an electrically conducting manner, make contact with the cable shield 100, wherein the outer member 104 rests on an end side 112 of the sleeve member 66, which is located opposite the annular member 68, and is centered relative to the sleeve member 66 as a result of extensions 114 of the sleeve member 66 and held in abutment on the end side 112, namely held on it acted upon by a force.

The outer member 104 is preferably not closed to form a complete ring but rather separated at one point by a gap 107 so that a radially elastic behavior of the outer member 104 can be generated by narrowing the gap 107 in order to be able to insert the outer member 104 with tension into a receptacle on the circumferential side.

The outer member 104 is preferably formed by a receiving part 116 which is U-shaped in cross section and open towards the central axis 16 and accommodates a holding ring 118, wherein the bristles 106 are designed to wind around the holding ring 118 on its outer side facing the U-shaped receiving part 116 and, therefore, as a result of pressing the receiving part 116 and the holding ring 118 together the bristles located therebetween are fixed in position.

The bristles 106 preferably extend in geometrical surfaces or planes 120 which extend transversely to the central axis 16 and at a distance from the fastening section 12.

Figure 4:
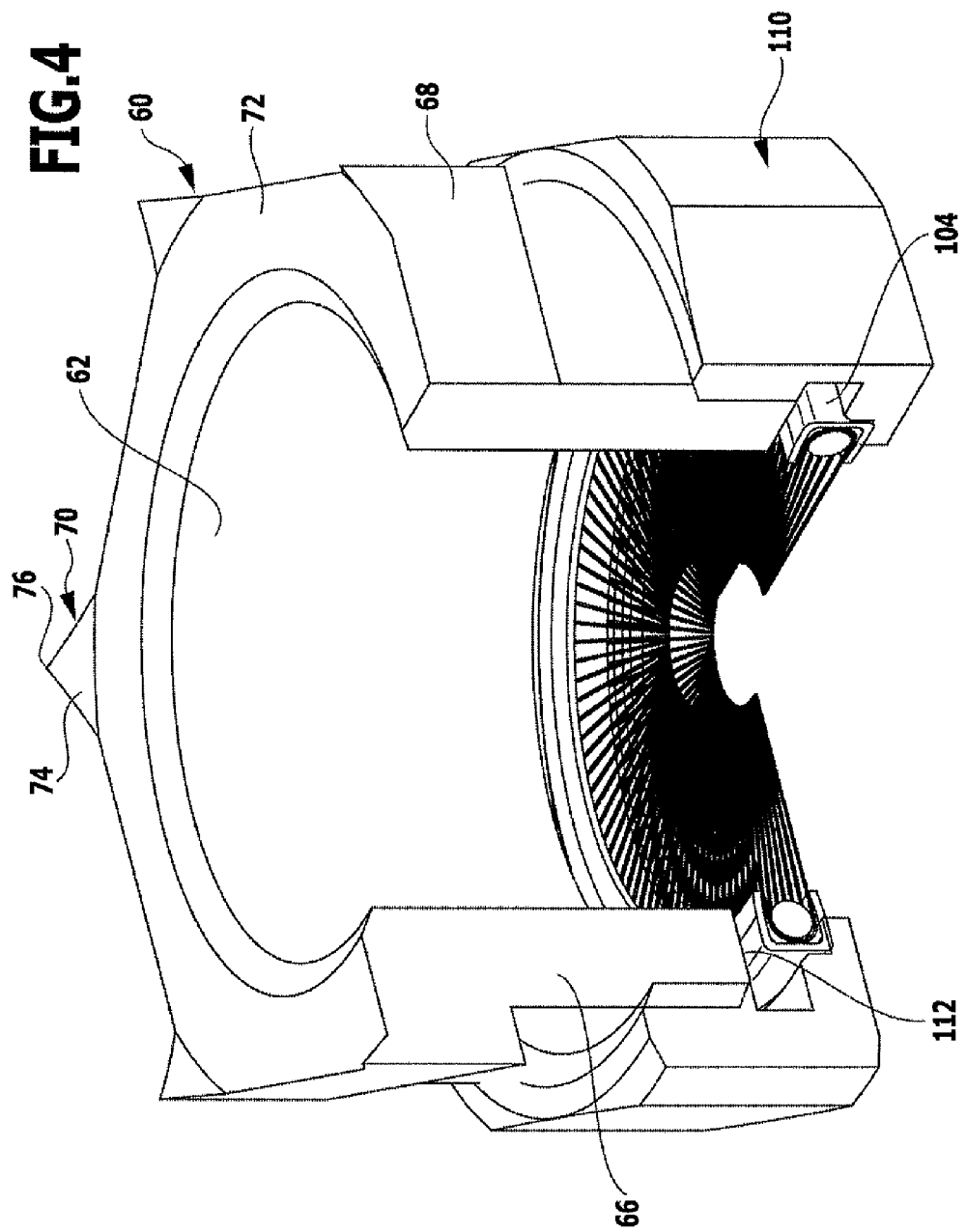
FIG. 4 shows a perspective, partially cutaway view of a shield contact element of a second embodiment of a cable feedthrough according to the invention.

In a second embodiment, illustrated in FIG. 4, the outer member 104 of the bristle element 102 can be pressed onto the end side 112 of the sleeve member 66 in that a swivel nut 110, which engages over the outer member 104 on a side located opposite the end side 112 and presses it against the end side 112, can be screwed onto the sleeve member 66 from the side of the end side 112.

Figure 5:
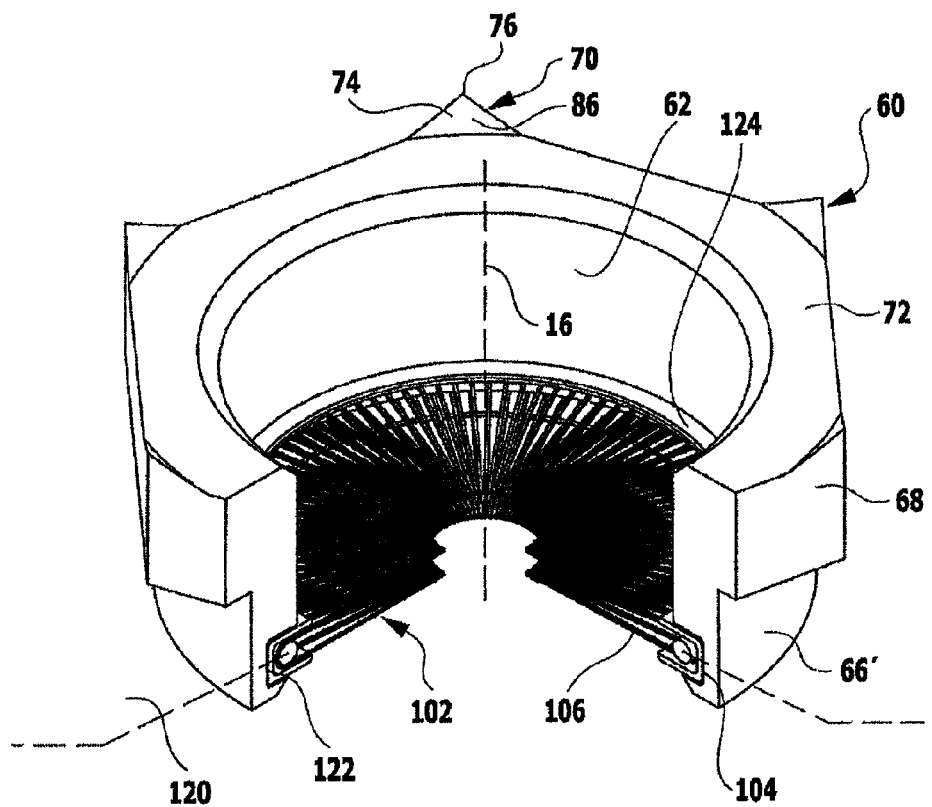
FIG. 5 shows a perspective, partially cutaway view of a shield contact element of a third embodiment of a cable feedthrough according to the invention.

In a third embodiment of a cable feedthrough according to the invention, illustrated in FIG. 5, the sleeve member 66' is, in contrast to the first embodiment, provided with a groove 122 which runs around the central axis 16 and in which the outer member 104 of the bristle element 102 is accommodated, wherein the groove 122 extends from an inner side 124 of the sleeve member 66' into it and is arranged such that the groove 122 is arranged in an area of the sleeve member 66' which projects beyond the fastening section 12 and so the bristles 106 can extend in the plane 120 which runs transversely to the central axis 16 and at a distance from the fastening section 12.

Figure 6:
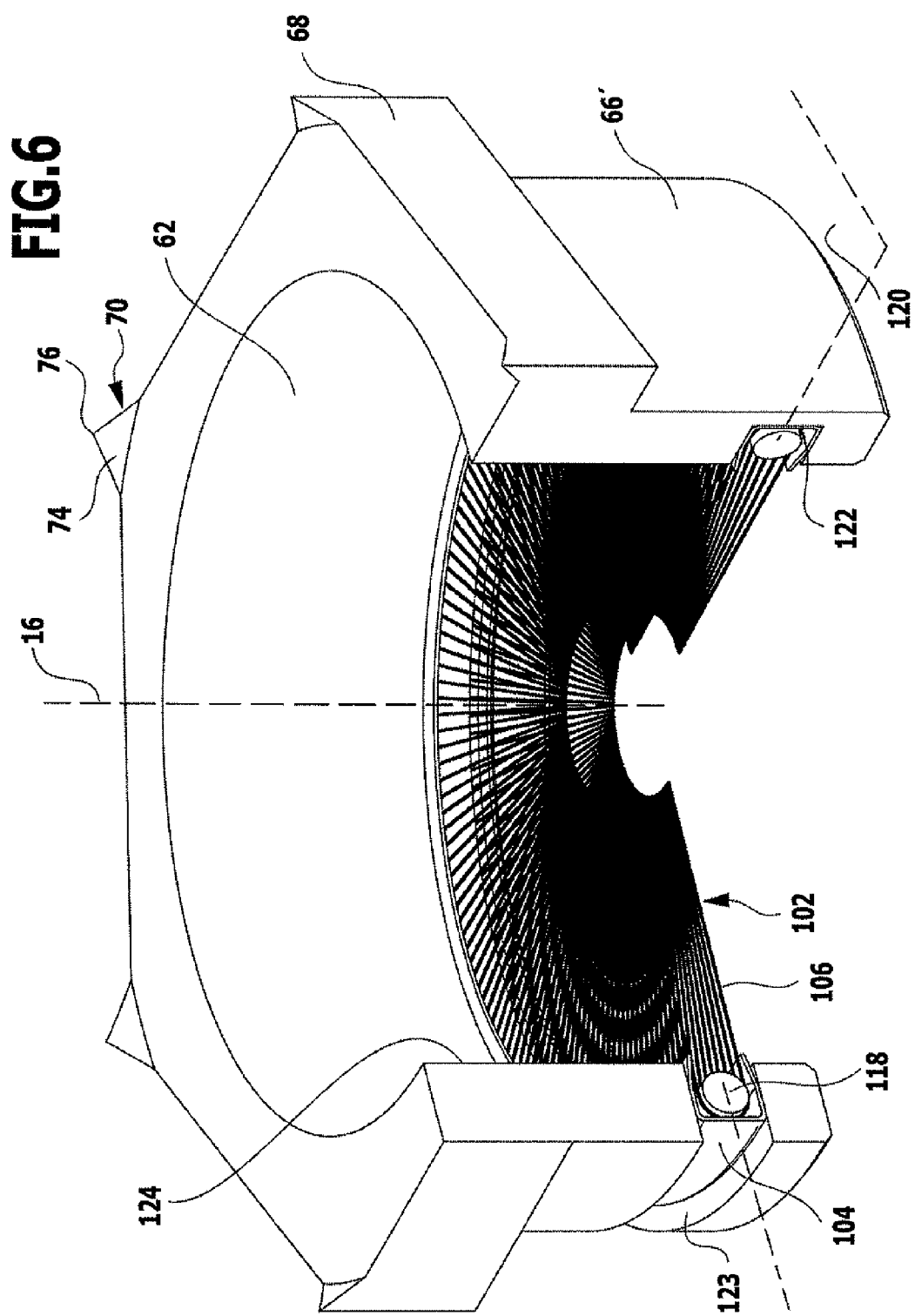
FIG. 6 shows a perspective, partially cutaway view of a shield contact element of a fourth embodiment of a cable feedthrough according to the invention.
Figure 7:
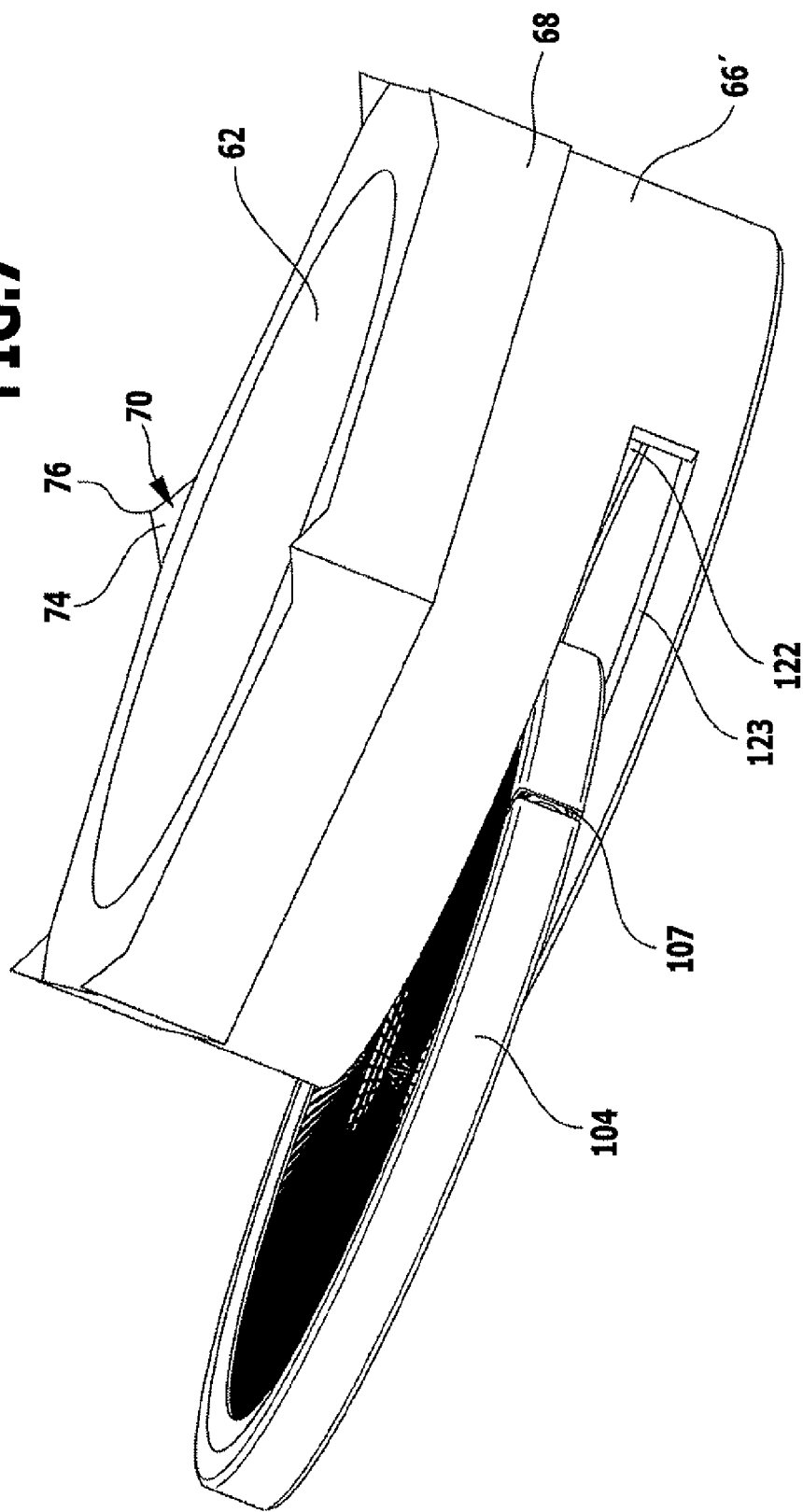
FIG. 7 shows a perspective side view of a shield contact element of the fourth embodiment of a cable feedthrough according to the invention.

In a fourth embodiment of a cable feedthrough according to the invention, illustrated in FIGS. 6 and 7, the sleeve member 66' comprises a lateral opening 123, via which the outer member 104 of the bristle element 102 can be pushed into the groove 122, wherein the opening 123 preferably extends over somewhat less than half the circumference of the groove 122 and so the outer member 104 can be inserted into the groove 122 through the opening 123 as a result of deformation of the outer member and, as a result, be fixed in place in the groove 122.

As a result of the fact that the outer member 104 is not a ring member closed upon itself but has two ends limiting a gap 107, the outer member 104 can be deformed sufficiently in a spring elastic manner with respect to its outer dimensions for the purpose of pushing it through the opening 123.

Figure 8:
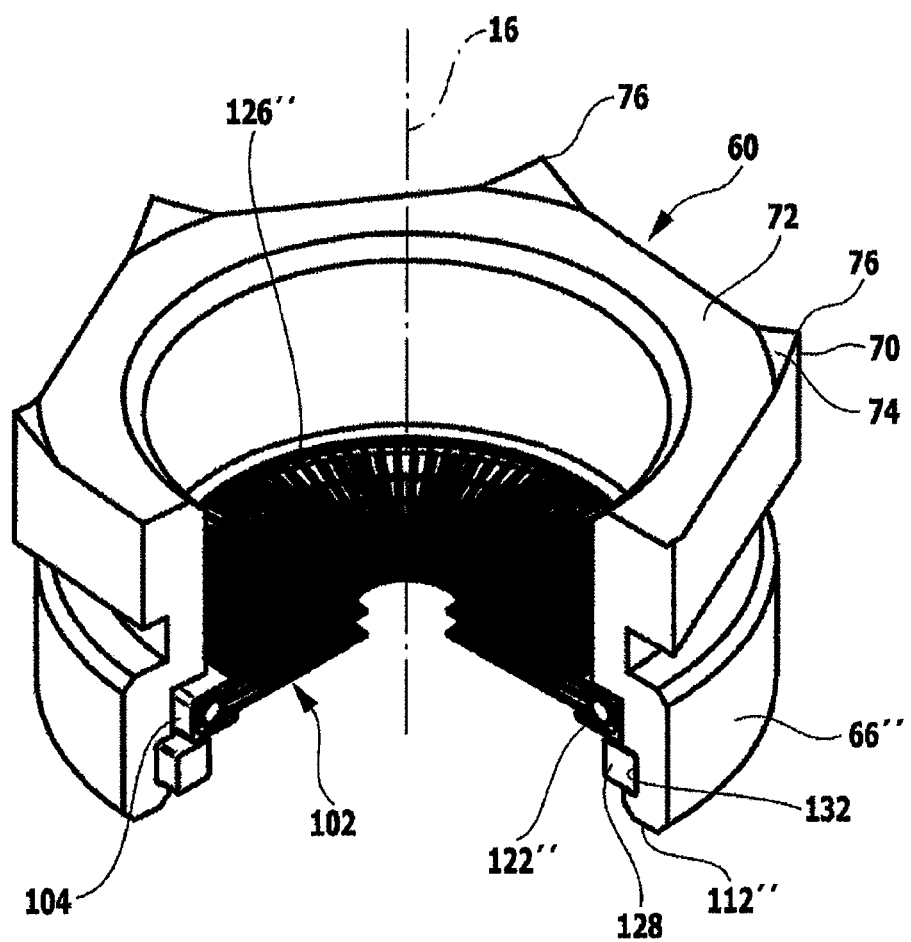
FIG. 8 shows a perspective, partially cutaway view of a shield contact element of a fifth embodiment of a cable feedthrough according to the invention.

In a fifth embodiment of a cable feedthrough according to the invention, illustrated in FIG. 8, the sleeve member 66" is provided with a recess 122" which is open not only in the direction of the central axis 16 but also in the direction of the end side 112" of the sleeve member 66" so that the bristle element 102 can be inserted into the recess 122" from the side of the end side 112" and can abut on a flange surface 126" of the recess 122".

In order to fix the outer member 104 of the bristle element 102 in place, a securing ring 128 is provided which can be inserted into a corresponding securing groove 132 which extends radially outwards into the sleeve member 66" proceeding from the recess 122" and is in a position to accommodate the securing ring 128 such that this fixes the outer member 104 of the bristle element 102 in the recess 122" between itself and the flange surface 126".

Figure 9:
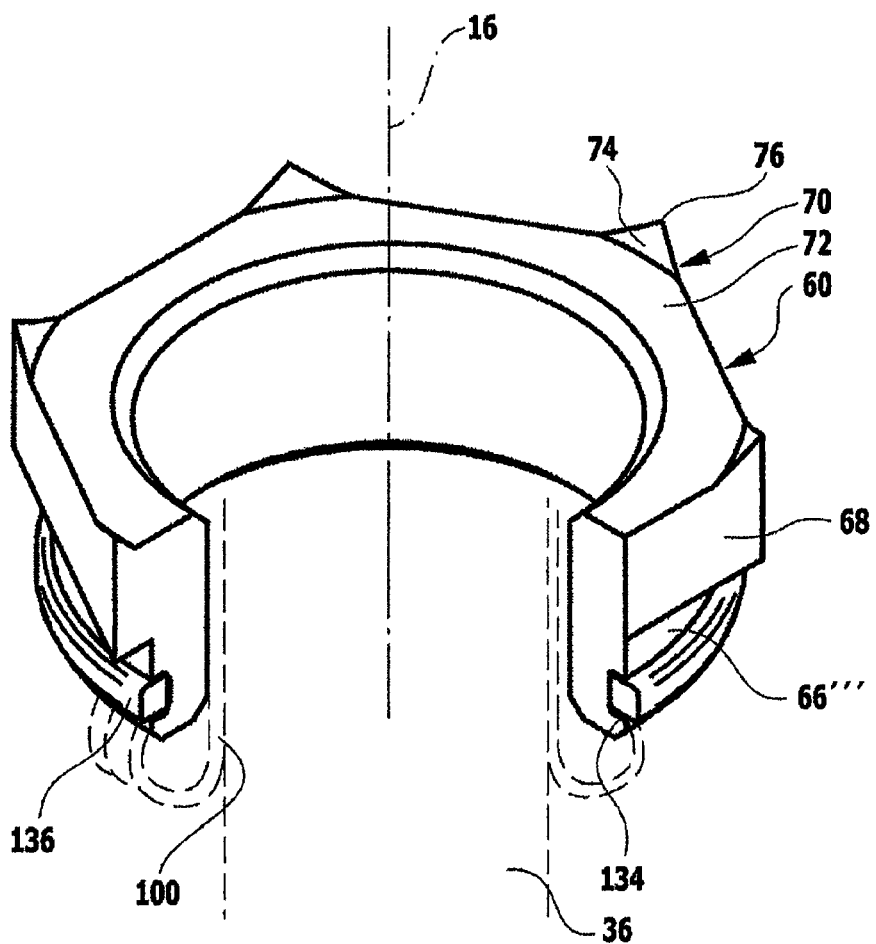
FIG. 9 shows a perspective, partially cutaway view of a shield contact element of a sixth embodiment of the cable feedthrough according to the invention.

In a sixth embodiment of a cable feedthrough according to the invention, illustrated in FIG. 9, the sleeve member 66''', on a side facing away from the central axis 16, comprises an external groove 134, into which a holding ring 136 can be inserted, wherein the groove 134 and the holding ring 136 are designed such that with the holding ring 136 removed the cable shield 100 of the cable 36 can be bent over and can be pressed by the holding ring 136 into the groove 134 in order to provide an electrical connection between the cable shield 100 and the sleeve member 66'''.

Figure 10:
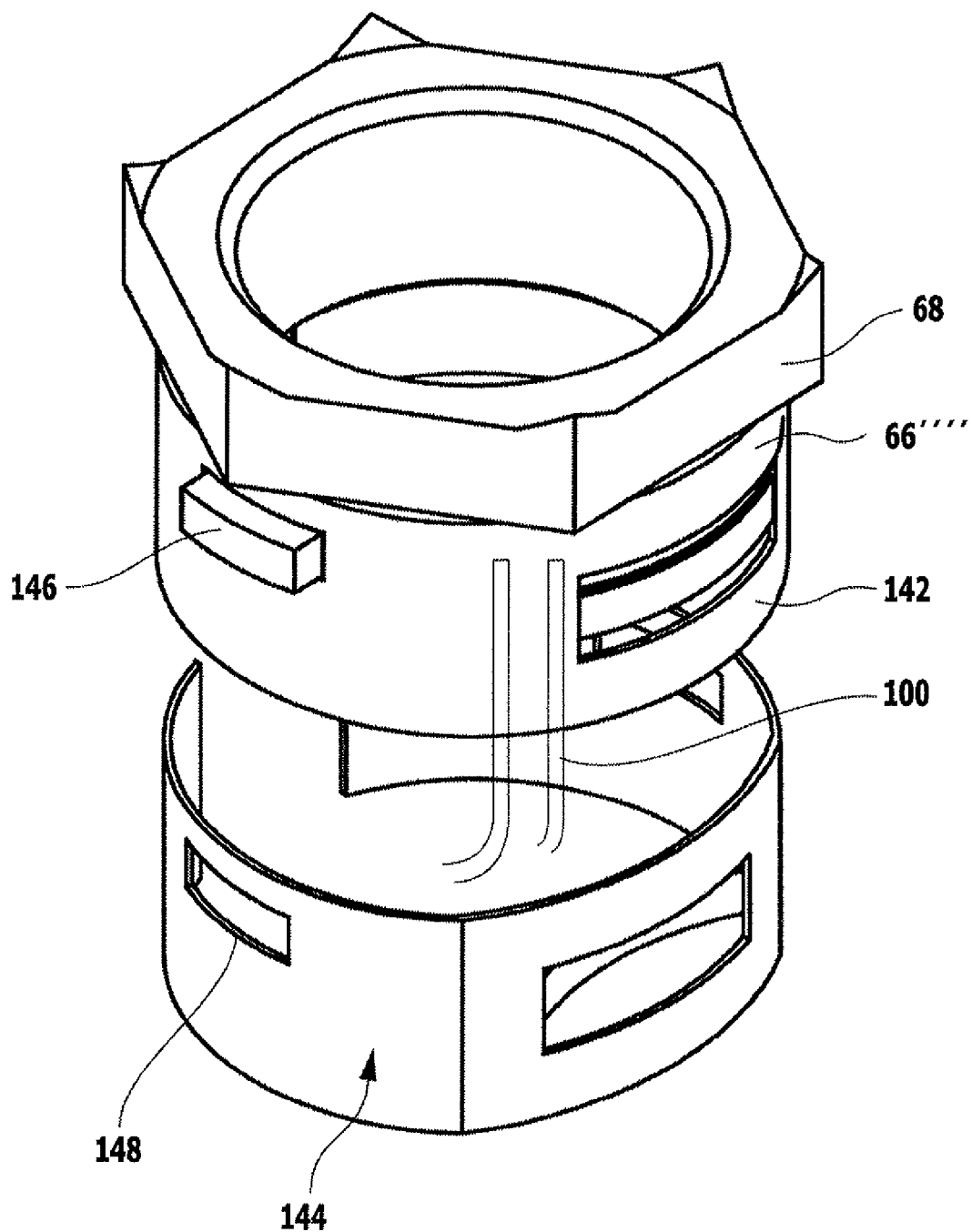
FIG. 10 shows a perspective view of a shield contact element of a seventh embodiment of the cable feedthrough according to the invention.

In a seventh embodiment, illustrated in FIG. 10, the sleeve member 66'''' is designed such that a holding ring 144 can be placed on an outer surface 142 thereof and this holding ring can be fixed in place, for example, by a first form locking element 146 provided on the sleeve member 64'''' and a form locking element 148 provided on the holding ring, wherein the holding ring 144 is of a C-shaped design and can be widened in a simple manner by way of elastic deformation on account of the fact that it is not closed upon itself in order to place it on the outer surface 142 and bring the form locking elements 146 and 148 into engagement with one another.

Furthermore, the wires of the cable shield 100 can be clamped between the holding ring 144 and the outer surface 142 of the sleeve member 66''''.

Figure 11:
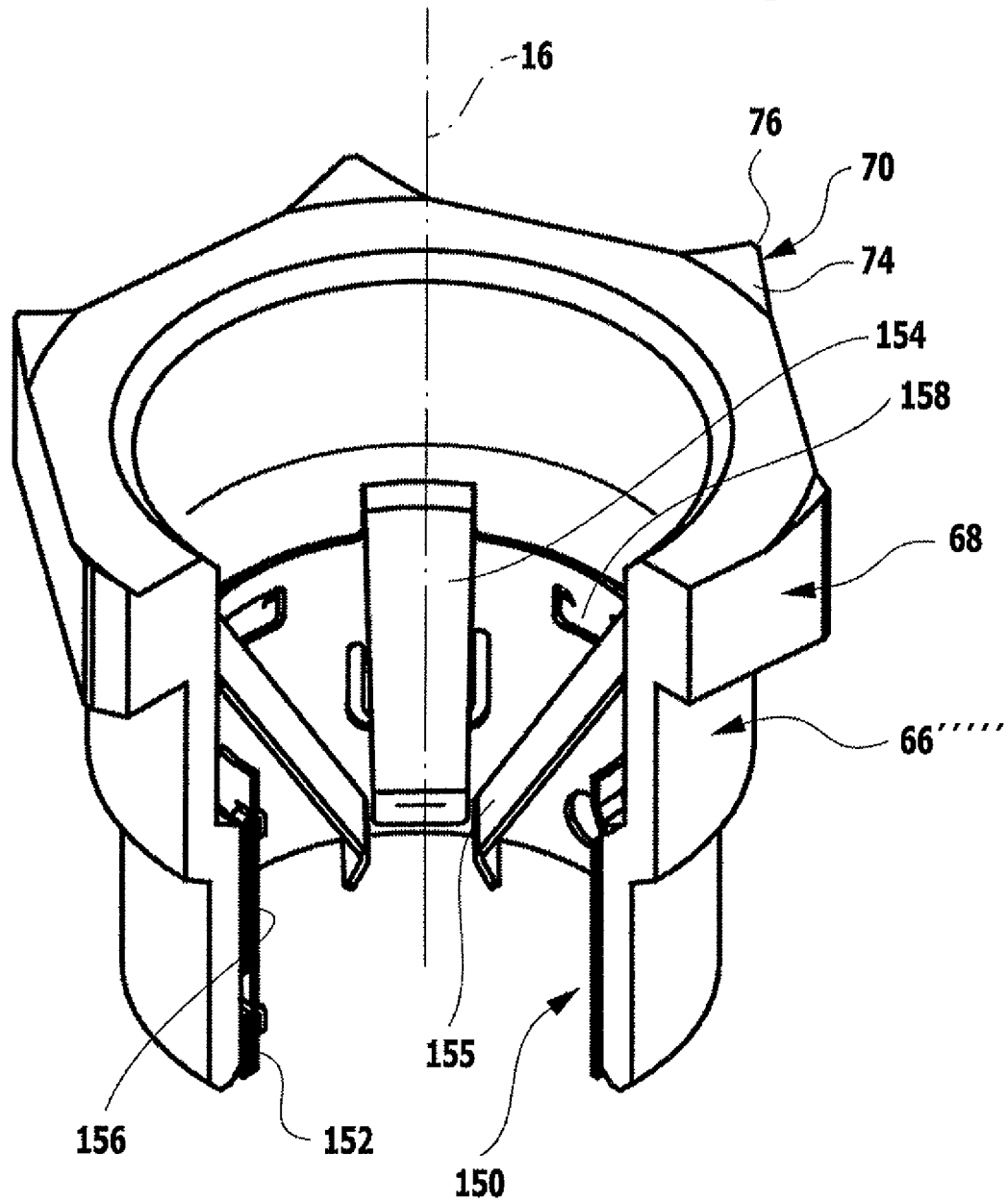
FIG. 11 shows a perspective, partially cutaway view of a shield contact element of an eighth embodiment of the cable feedthrough according to the invention.

In an eighth embodiment, illustrated in FIG. 11, the sleeve member 66''''' is provided with an insert 150 which has a clamping sleeve 152 and has contact bridges 154 which protrude from the clamping sleeve in the direction of the central axis 16 and are held on the clamping sleeve 152 in a spring-like manner in a radial direction in relation to the central axis 16 and with clamping arms 155 limit an opening for a cable 36 with an exposed cable shield 100 which is widened as a result of the cable 36 with the exposed cable shield 100 being introduced.

The clamping sleeve 152 is, for its part, fixed in place within the sleeve member 66''''', namely on an inner side 156 thereof, either in a force locking manner, preferably in a form locking manner, in addition, wherein bulges 158 in the clamping sleeve 152 engage in corresponding recesses in the sleeve member 66''''' in order to secure the clamping sleeve 152 against movements in a direction parallel to the central axis 16.

As a result of the contact bridges, it is possible for electrical contact to be made with a cable shield 100 of a cable 36 pushed through it and, therefore, for an electrically conducting connection to result between the cable shield 100, the contact bridges 154, the clamping sleeve 152, the sleeve member 66''''' and the projections 74 which dig with their points 76 into the wall section 22 in order to likewise make an electrically conducting connection with it and so a continuous, electrically conducting connection can be provided between the cable shield 100 and the wall section 22.

Figure 12:
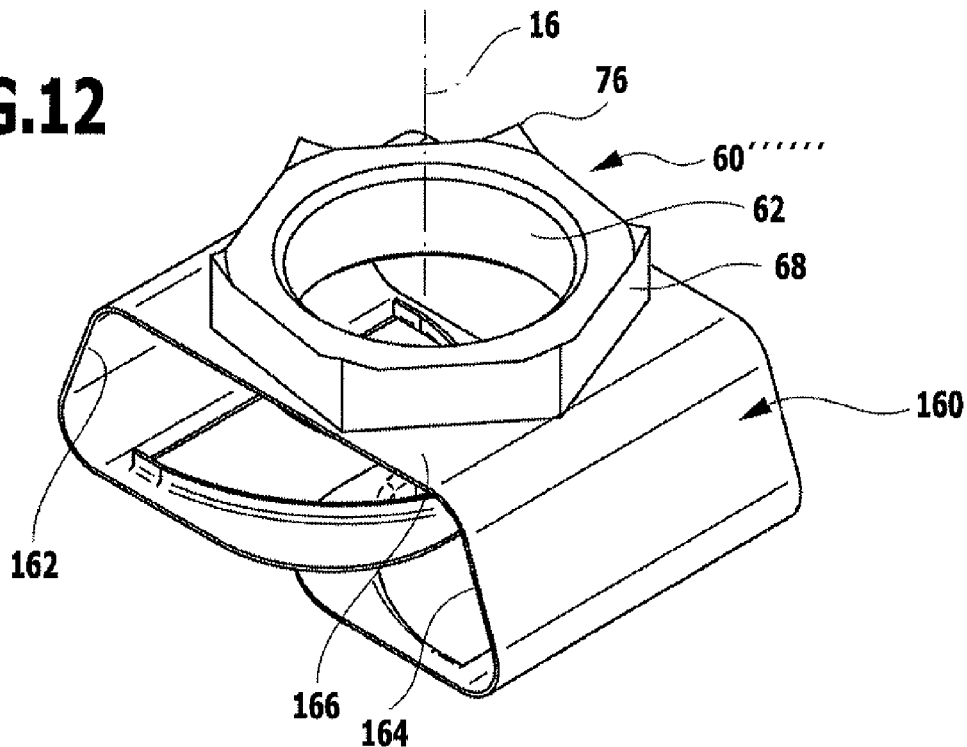
FIG. 12 shows a perspective view of a shield contact element of a ninth embodiment of the cable feedthrough according to the invention.
Figure 13:
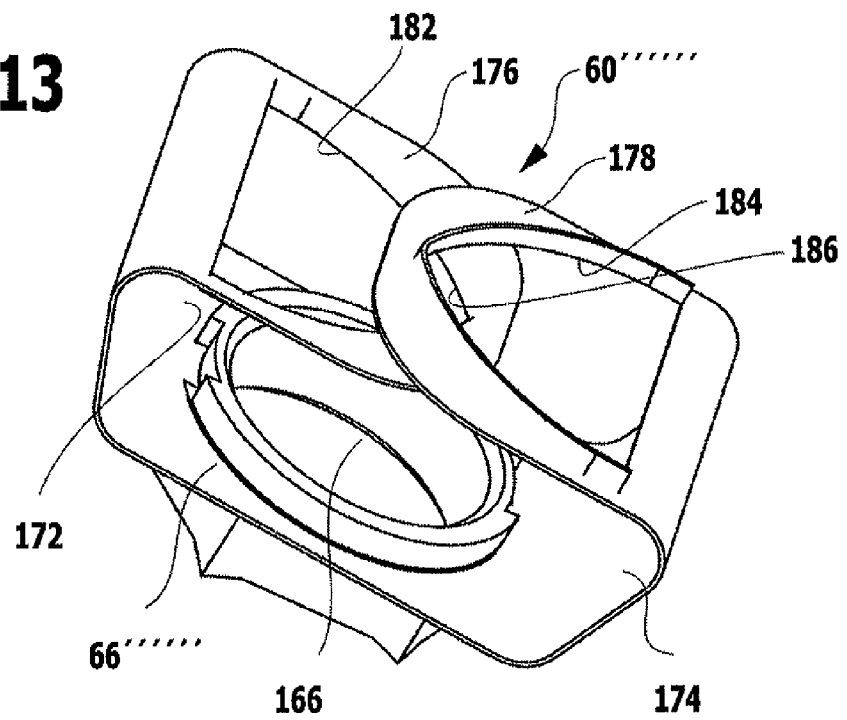
FIG. 13 shows a reversed perspective view of the shield contact element according to FIG. 12.

In a ninth embodiment, illustrated in FIGS. 12 and 13, a bridge member 160 is held on the sleeve member 66'''''' and this has two contact bridges 162 and 164 which extend as far as clamping sections 176 and 178, which run transversely to the central axis 16 and abut on one another, with spring-elastic arc sections 172 and 174 proceeding from a common fastening section 166 which is held on the sleeve member 66'''''.

The two clamping sections 176 and 178 each have openings 182 and 184 which form, in an overlapping area 186, a through opening for the cable 36 with the exposed cable shield 100 which is radially variable in cross section and make contact with the cable shield 100 in that the opening 186 has, on account of the elasticity of the contact bridges 162 and 164 in the non-deformed state thereof, a cross sectional surface area which is smaller than the cross sectional surface area of the cable 36 and which can be increased in size as a result of deformation of the contact bridges 162 and 164 to such an extent that the cable 36 with the cable shield 100 can be pushed through, wherein on account of the elasticity of the contact bridges 162 and 164 they have the tendency to reduce the cross sectional surface area of the opening 186 to such an extent that the clamping sections 176 and 178, in particular with edge areas of the openings 182, 184, abut in a scissors-like manner on the cable shield 100 of the cable 36 and make contact with it reliably.

In the second to ninth embodiments, only the sleeve members and/or the shield contact elements have been described and nothing has been said concerning the housing connection piece and its design.

Insofar as in the second to ninth embodiments no further comments have been made concerning features of the shield contact element and the housing connection piece as well as the fixing of the cable in place in the housing connection piece by means of the fin basket 30 and the ring seal 32, reference is made in full to the comments on the first embodiment with respect to the second to ninth embodiments.

Figure 14:
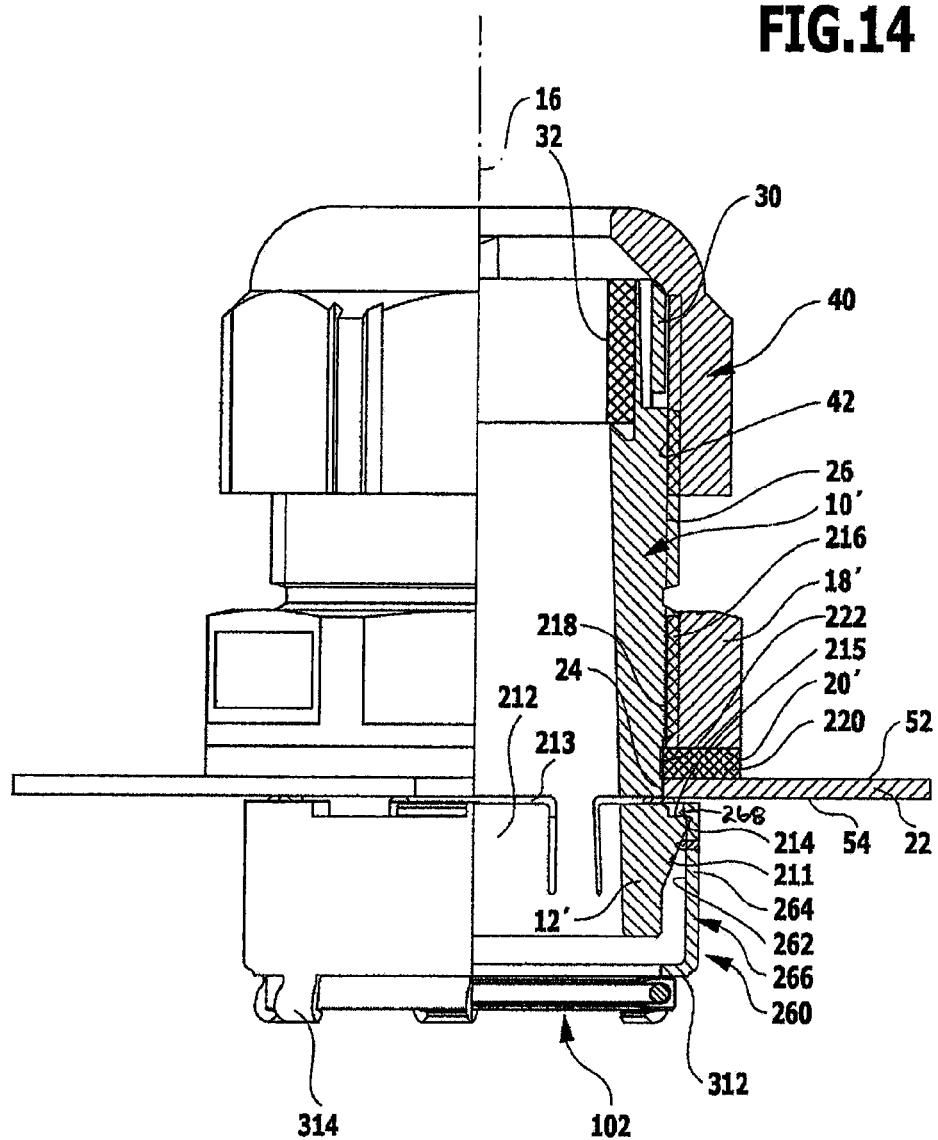
FIG. 14 shows a partially cutaway view of a tenth embodiment of the cable feedthrough according to the invention with a shield contact element.
Figure 15:
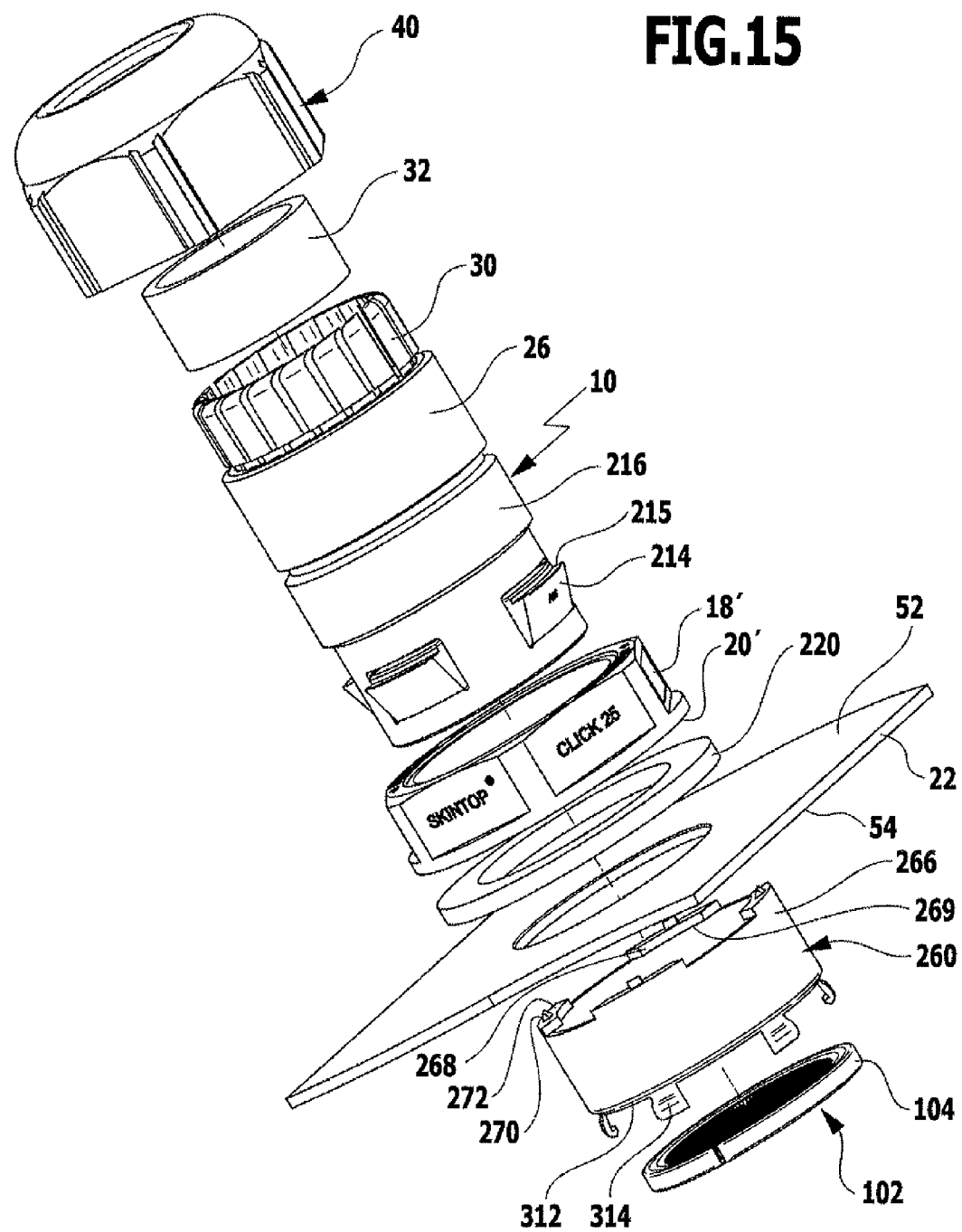
FIG. 15 shows a perspective exploded illustration of the tenth embodiment.
Figure 16:
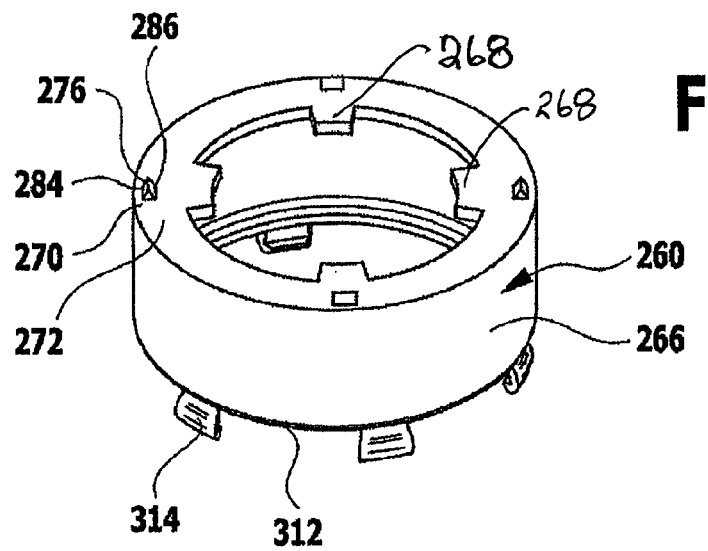
FIG. 16 shows a perspective view of the shield contact element of the tenth embodiment.

A tenth embodiment of a cable feedthrough according to the invention, illustrated in FIGS. 14 to 16, likewise comprises a housing connection piece 10' which is provided with a fastening section 12' which has, however, instead of the outer thread 14 at least one supporting element 214 which is arranged on the fastening section 12' and projects beyond the opening 24 radially to the central axis 16 when a housing connection piece 10' is mounted in the opening 24 and has at least one supporting surface 215 which projects radially beyond the opening 24, faces the second side 54 of the wall section 22 and offers the possibility of the fastening section 12' of the housing connection piece 10' being supported directly or indirectly on the wall section 22 with this at least one supporting surface 215.

The supporting surface 215 is arranged stationarily in the direction of the central axis 16 relative to the fastening section 12' so that it is necessary, for the purpose of adapting it to different wall thicknesses of the wall section 22 or also for clamping the wall section 22 in a force locking manner between the supporting surface 215 and the pressure collar 18', to arrange the pressure collar 18' on the housing connection piece 10' so as to be adjustable in the direction of the central axis 16.

For this reason, the housing connection piece 10' is provided with an outer thread 216 which engages with an inner thread 218 of the pressure collar 18' so that when the pressure collar 18' is turned its position in the direction of the central axis 16 is adjustable.

The outer thread 216 and the inner thread 218 preferably represent opposed threads in relation to the threads 26 and 42, with which the cap nut 40 can be screwed on, and so torque exerted on the housing connection piece 10' when the cap nut 40 is screwed on leads to the pressure collar 18' and the supporting element 214 with the supporting surface 215 moving towards one another in order to clamp the wall section 22 between them.

A sealing element 220, which abuts, on the one hand, on a thread-free outer surface 222 of the housing connection piece 10' and extends between the pressure surface 20' and the first side 52 of the wall section 22, is preferably arranged between the pressure collar 18' and the first side 52 of the wall section 22.

In this respect, the sealing element 220 is arranged such that it also expands in a radial direction when compressed between the pressure surface 20' and the first side 52 of the wall section 22 and, therefore, abuts on the thread-free outer surface 222 of the housing connection piece 10' in a manner acted upon by a force in order to ensure a seal between the first side 52 of the wall section 22 and the housing connection piece 10'.

As for the rest, the housing connection piece 10' is, with respect to the design of the fin basket 30 and the ring seal 32 for fixing a cable 36 in place as well as the design of the cap nut 40, of an identical construction to the first embodiment and so in this respect reference can be made in full to the comments on the preceding embodiments.

In the tenth embodiment, the wall areas 212 of the fastening section 12' which bear the supporting elements 214 are released by a U-shaped separating join 213 in such a manner that the wall areas 212 together with the supporting elements 214 can move inwards from a supporting position in a spring-like manner to such an extent that the supporting surface 215 is within a maximum radial extension of the fastening section 12' which is less than the opening 24 in the wall section 22 and so the fastening section 12 can be pushed through the opening 24 proceeding from the first side 52 of the wall section 22 and, therefore, the at least one supporting element 214 finally projects beyond the second side 54 of the wall section 22.

The supporting elements 214 are, for this purpose, preferably provided with inclined insertion surfaces 211.

In the tenth embodiment, the shield contact element 260 comprises as holding element 264 the sleeve member 266, the inner wall 262 of which has such a diameter that it corresponds at least to the radial extension of the supporting elements 214 in the supporting position and so the sleeve member 266 is in a position to engage around the supporting elements 214 radially and externally.

Furthermore, flange segments 268 are integrally formed on the sleeve member 266 and these project inwards beyond the inner wall 262 radially to the central axis 16 and are in a position to engage over the supporting surface 215 so that the flange segments 268 abut on the at least one supporting surface 215 with a contact surface 269 which faces the supporting surface 215 and can abut on the second side 54 of the wall section 22 with an end side 272 which faces the second side 54 of the wall section 22.

In the case of the shield contact element 260, housing contact elements 270 are likewise provided on the end sides 272 and these rise above the end side 272 as projections and, as illustrated, in particular, in FIG. 16, have side surfaces 284 and 286 which run towards one another in the shape of a roof and form on a side facing away from the end side 272 a cutting edge 276 which runs parallel to a circumferential direction around the central axis 16 so that any turning of the shield contact element 260 leads to the cutting edges 276 digging into the second side 5 of the wall section 22 in the same way as is the case with the points 76 of the embodiments one to seven.

In order to make contact with the cable shield 100, a bristle element 102 is provided in the same way as in the first to third embodiments and this is constructed in the same way as in the first to third embodiments and like the extensions 114 of the first embodiment is fixed to the sleeve member 266 in corresponding extensions 314 thereof, wherein the bristle element rests on the end side 312 of the sleeve member 266 in the same way as in the first embodiment.

If the housing connection piece 10' of the tenth embodiment is pushed with the fastening section 12' through the opening 24 of the wall section 22 to such an extent that the supporting elements 214 project beyond the second side 54 of the wall section 22, a preliminary fixing of the housing connection piece 10' on the wall section 22 is already brought about.

The shield contact element 260 is now placed in position such that the sleeve member 266 is pushed with the flange segments 268 over the fastening section 12' to such an extent until the flange segments 268 abut on the second side 54 with the housing contact elements 270 borne by them, in particular their cutting edges 276, wherein the flange segments 268 are located between the individual supporting elements 214 and the flange segments 268 move between the supporting elements 214 and the second side of the wall section 22 as a result of turning of the shield contact element 260 and so the supporting elements 214 abut on the underside contact surface 269 of the flange segments 268 with their supporting surfaces 215 and, therefore, the flange segments 268 are acted upon by the supporting elements 214 in the direction of the second side 54 of the wall section 22 in order to press the housing contact elements 270 onto or into the second side 54 of the wall section 22.

When the pressure collar 18' is turned relative to the housing connection piece 10' in such a manner that the pressure surface 20' is moved in the direction of the first side 52 of the wall section 22 in order to thus act on the first side 52 of the wall section 22 via the sealing element 220, the fastening section 12' will be moved with the supporting elements 214 in the direction of the second side 54 of the wall section 22 in order to, finally, clamp the second wall section 22 between the supporting elements 214 and the pressure collar 18' indirectly, wherein the housing contact elements 270 will be pressed into the second side 54 of the wall section 22 as a result and the sealing element 22 squeezed so that it causes a sealed closure between the first side 52 of the wall section 22 and the housing connection piece 10' in the area of the outer surface 222 in the manner described.

Figure 17:
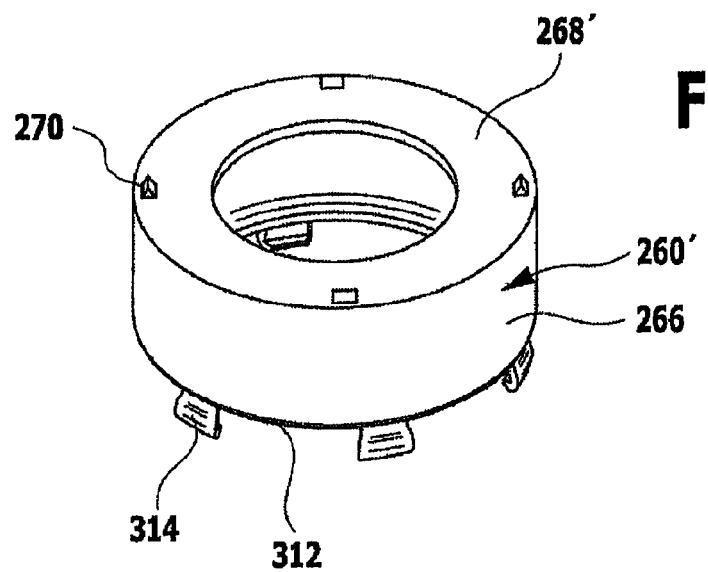
FIG. 17 shows a perspective view of a shield contact element of an eleventh embodiment of the cable feedthrough according to the invention.

In an eleventh embodiment, illustrated in FIG. 17, the shield contact element 260' is designed such that it does not have individual flange segments 268 but rather a continuous annular flange 268', on which the housing contact elements 270, which are designed in the same way as in the eighth embodiment, are arranged.

In this case, the shield contact element 260' is placed on the fastening section 12' such that as a result of the annular flange 268' the supporting elements 214 are likewise pressed inwards radially to the central axis 16 in a spring-like manner, in the same way as when they are pushed through the opening 24, and until the flange ring 268' is located between the supporting elements 214 and the second side 54 of the wall section 22.

In order to enable the housing contact elements 270 to dig into the side 54 of the wall section 22 with their cutting edges 276 reliably, an optional turning of the shield contact element 260' can take place for such a time until a sufficient digging into the second side 54 of the wall section 54 is achieved.

Figure 18:
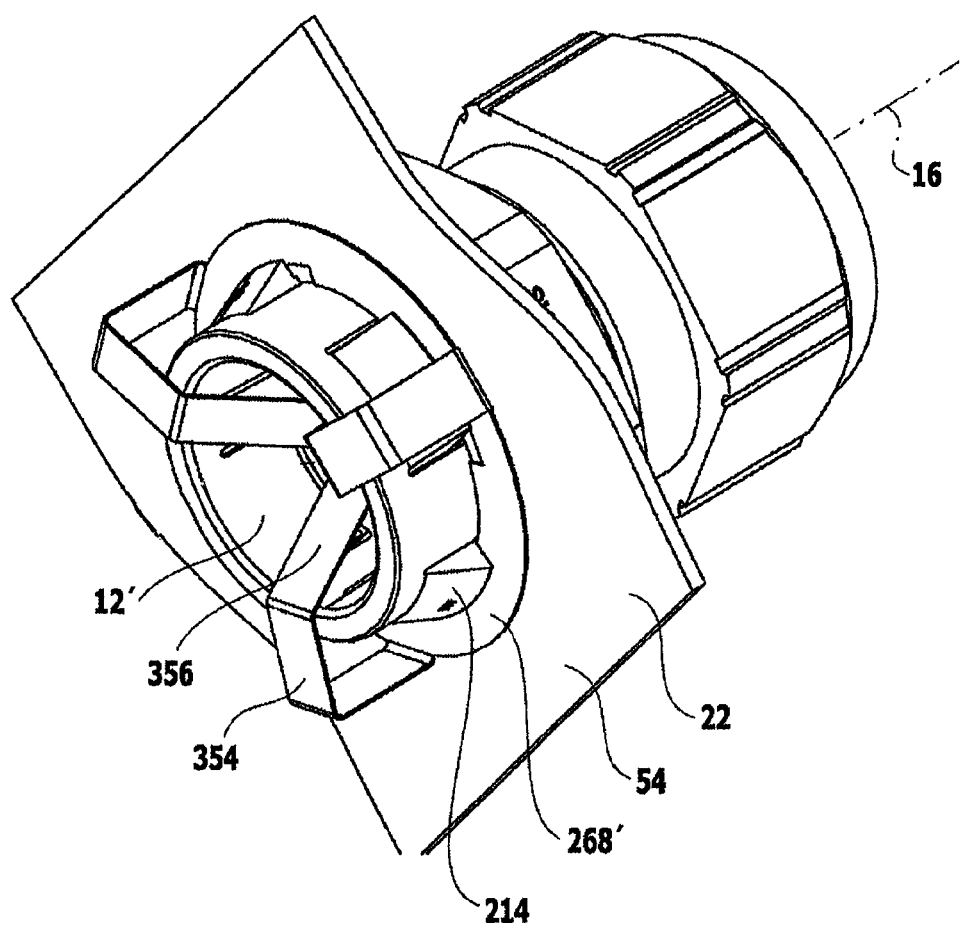
FIG. 18 shows a perspective view of a twelfth embodiment of a cable feedthrough according to the invention.

In a twelfth embodiment, illustrated in FIG. 18, those parts which are identical to those of the eighth and ninth embodiments are provided with the same reference numerals and so reference can likewise be made in full to the comments on these embodiments and their references.

In the twelfth embodiment, in contrast to the eleventh embodiment, no sleeve member 266 is provided but rather only the circumferential annular flange 268' which bears the housing contact elements 70.

Proceeding from the annular flange 268', contact bridges 354 extend with clamping arms 356 into an interior of the fastening section 12 in order to make contact with a cable shield 100 located therein, wherein the contact bridges 354 are designed to be spring-like in a radial direction relative to the central axis 16 and, as a result, the clamping arms 356 form a through opening for the cable 36 with exposed cable shield 100 which is radially variable in its cross section and will be widened when the cable 36 with exposed cable shield 100 is pushed in so that as a result of this deformation of the contact bridges 354 the clamping arms 356 will act on the cable shield 100 with an adequately large force and enable a reliable contact to be made with it.

The flange ring 268' is likewise fixed in place by means of the supporting elements 214 in that the fastening section 12 is pressed through the flange ring 268', wherein the supporting elements 214 deviate radially inwards in a spring-like manner in conjunction with the manner described in the eighth and ninth embodiments in order to, finally, engage behind the flange ring 268' with the supporting surfaces 215 on a side located opposite the wall section 22.

As for the rest, reference can be made in full to the tenth and eleventh embodiments with respect to the description of the additional features of the tenth embodiment.

Figure 19:
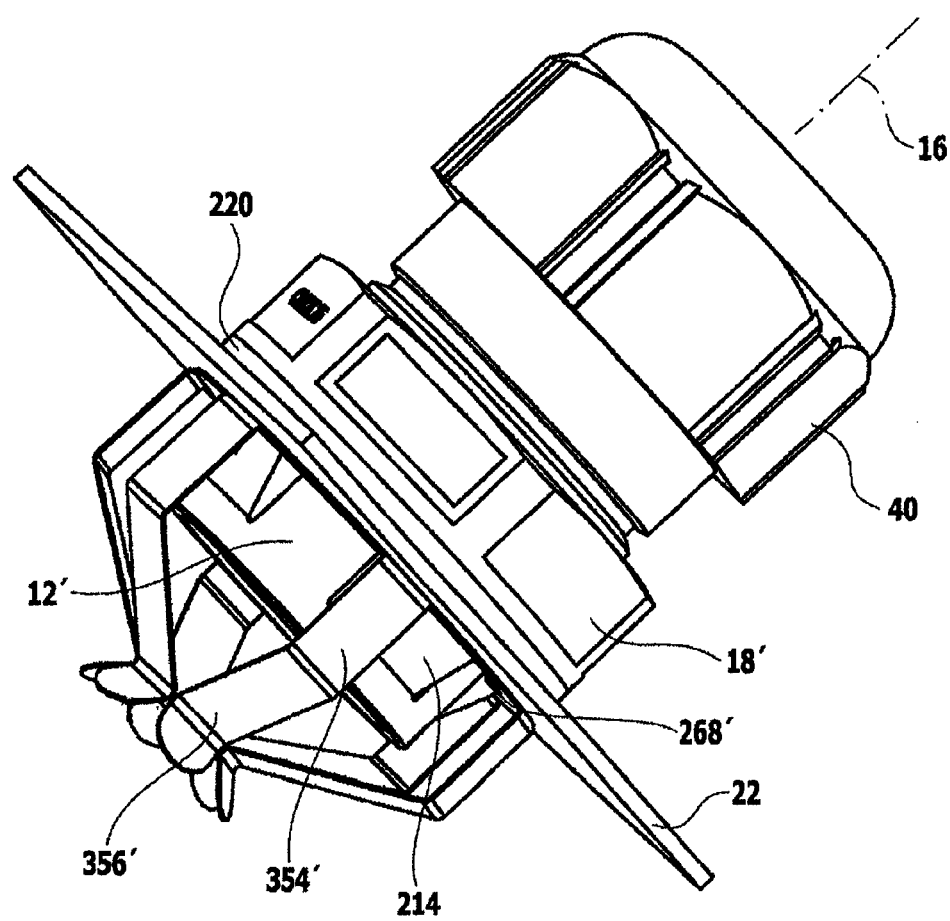

In the thirteenth embodiment, as well, illustrated in FIG. 19, only a flange ring 268' is present in the same way as in the tenth embodiment and this engages behind the supporting elements 214 on a side located opposite the wall section 22.

In the same way as in the tenth embodiment, contact bridges 354' extend from the flange ring 268', are designed to be spring-like radially to the central axis 16 and form with their clamping arms 356' in the state not acted upon a through opening for the cable 36 with exposed cable shield 100 which is radially variable in its cross section and is located at a distance from the fastening section 12, namely on a side thereof facing away from the pressure collar 18'.

As in the twelfth embodiment, introduction of a cable 36 with exposed cable shield 100 results in a widening of the through opening and, therefore, in a reliable contact.

As for the rest, this embodiment is designed in the same way as the tenth, eleventh and twelfth embodiments and so reference can be made in full to these embodiments with respect to the description of the individual elements.

In a fourteenth embodiment, illustrated in FIG. 20, m contrast to the eighth to eleventh embodiments no supporting elements 214, which are designed to be spring-like radially to the central axis 16, are provided but rather supporting elements 214' which are arranged rigidly on the fastening section 12" but project radially only on one side of the fastening section 12" has a recess 390 on half its side which reduces a diameter thereof and enables the fastening section 12" to be guided through the opening 24 of the wall section 22 despite projecting supporting elements 214' and the fastening section 12" to be fixed in place in the opening 24 such that it is centered in the opening 24 by a centering surface 392 of the fastening section 12 when the supporting element 214' projects radially beyond the opening 24 on the second side 54 of the wall section 22 in order to fix the fastening section 12" in place in the opening 24.

Furthermore, the shield contact element 260 is designed, for example, as described in conjunction with the ninth embodiment, wherein in this case the supporting element 214' engages behind the flange ring 268' on one side in order to also keep the shield contact element on the wall section 22 in engagement on the second side 54 of the wall section 22 while the pressure collar 18' is being turned in order to secure the housing connection piece 10" to the fastening section 12".

As for the rest, this embodiment is designed in the same way as the embodiments ten to twelve and so reference can be made to them in full.

The invention claimed is:

1. Cable feedthrough comprising a housing connection piece, a cable fixing device provided on the housing connection piece, a fastening section provided on the housing connection piece the fastening section extending through an opening of a wall section of an appliance for securing the housing connection piece to the wall section of the appliance and a shield contact element making contact with a cable shield of a cable guided through the cable feedthrough, the shield contact element comprising a holding element, said holding element being adapted to be fixed to the fastening section and the shield contact element making contact with the cable shield, on the one hand, and, on the other hand, making electrical contact with the wall section of the appliance with at least one housing contact element designed to dig into the wall section, the at least one housing contact element is configured as a projection provided on the holding element.

2. Cable feedthrough as defined in claim 1, wherein the projection has a sharp-edged contour facing the wall section, the projection configured to dig into a surface of the wall section with said contour.

3. Cable feedthrough as defined in claim 2, wherein the sharp-edged contour is aligned such that it moves on a path around the central axis of the housing connection piece during movement of the projection and digs into the surface of the wall section.

4. Cable feedthrough as defined in claim 1, wherein the shield contact element is configured to be fixed to the fastening section in a form locking manner.

5. Cable feedthrough as defined in claim 1, wherein the holding element is adapted to be fixed to the fastening section by a screw connection.

6. Cable feedthrough as defined in claim 1, wherein the holding element is adapted to be fixed to the fastening section by a form locking element engaging behind the holding element.

7. Cable feedthrough as defined in claim 1, wherein the housing connection piece is formed from an electrically non-conducting material.

8. Cable feedthrough as defined in claim 7, wherein the housing connection piece consists of plastic.

9. Cable feedthrough as defined in claim 1, wherein the shield contact element has an electrically conducting surface.

10. Cable feedthrough as defined in claim 1, wherein the shield contact element is formed from an electrically conducting material.

11. Cable feedthrough as defined in claim 1, wherein the shield contact element has a bristle element for making contact with the cable shield.

12. Cable feedthrough as defined in claim 11, wherein the bristle element is designed as a bristle ring having electrically conducting bristles extending transversely in the direction of the central axis of the housing connection piece.

13. Cable feedthrough as defined in claim 11, wherein the bristle element is connected to the holding element of the shield contact element.

14. Cable feedthrough as defined claim 11, wherein the shield contact element comprises cable shield contact elements.

15. Cable feedthrough as defined claim 1, wherein the shield contact element has contact bridges for making electrical contact with the cable shield.

16. Cable feedthrough as defined in claim 15, wherein the contact bridges are connected to the holding element.

17. Cable feedthrough as defined in claim 15, wherein the contact bridges comprise clamping arms for making electrical contact with the cable shield, said arms being movable radially to the central axis of the housing connection piece in a spring-like manner.

18. Cable feedthrough comprising a housing connection piece, a cable fixing device provided on the housing connection piece, a fastening section provided on the housing connection piece the fastening connection extending through an opening of a wall section of an appliance for securing the housing connection piece to the wall section of the appliance and a shield contact element making contact with a cable shield of a cable guided through the cable feedthrough, the shield contact element being adapted to be fixed to the fastening section in a form locking manner the shield contact element having an annular member engaging around the fastening section of the housing connection piece, said annular member being provided with at least one housing contact element designed to dig into the wall section.

19. Cable feedthrough as defined in claim 18, wherein the shield contact element is adapted to be fixed in place by way of engagement between a supporting element of the fastening section and the wall section.

20. Cable feedthrough comprising a housing connection piece, a cable fixing device provided on the housing connection piece, a fastening section provided on the housing connection piece with the fastening connection extending through an opening of a wall section of an appliance for securing the housing connection piece to the wall section of the appliance and a shield contact element making contact with a cable shield of a cable guided through the cable feedthrough, the shield contact element being adapted to be fixed to the fastening section in a form locking manner, the shield contact element having a sleeve member surrounding the fastening section, said sleeve member being provided with at least one housing contact element designed to dig into the wall section.

21. Cable feedthrough comprising a housing connection piece, composed of an electrically non-conducting material, a cable fixing device defined on the housing connection piece, a fastening section comprised by the housing connection piece, the fastening section extending through an opening of a wall section of an appliance for securing the housing connection piece to the wall section of the appliance, and a shield contact element making contact with a cable shield of a cable extended through the cable feedthrough, the shield contact element comprising a holding element, said holding element fixing the fastening section and the shield contact element making contact with the cable shield, on the one hand, and, on the other hand, making electrical contact with the wall section of the appliance with at least one housing contact element configured to dig into the wall section.

22. Cable feedthrough comprising a housing connection piece composed of plastic, a cable fixing device provided on the housing connection piece, a fastening section comprised by the housing connection piece, the fastening section extending through an opening of a wall section of an appliance for securing the housing connection piece to the wall section of the appliance and a shield contact element making contact with a cable shield of a cable guided through the cable feedthrough, the shield contact element being configured to be fixed to the fastening section in a form locking manner, the shield contact element having an annular member engaging around the fastening section of the housing connection piece, said annular member being provided with at least one housing contact element configured to dig into the wall section.

23. Cable feedthrough comprising a housing connection piece consisting of plastic, a cable fixing device provided on the housing connection piece, a fastening section comprised by the housing connection piece, the fastening section extending through an opening of a wall section of an appliance for securing the housing connection piece to the wall section of the appliance and a shield contact element making contact with a cable shield of a cable guided through the cable feedthrough, the shield contact element being configured to fix to the fastening section in a form locking manner, the shield contact element having a sleeve member surrounding the fastening section, said sleeve member being configured with at least one housing contact element configured to dig into the wall section.

* * * * *

UNITED STATES PATENT AND TRADEMARK OFFICE
CERTIFICATE OF CORRECTION

PATENT NO. : 8,841,562 B2
APPLICATION NO. : 13/353753
DATED : September 23, 2014
INVENTOR(S) : Rolf Drotleff et al.

It is certified that error appears in the above-identified patent and that said Letters Patent is hereby corrected as shown below:

On the title page, item 73 Assignee should read: Lapp Engineering & Co., Cham (CH)

Signed and Sealed this
Fifth Day of January, 2016

Michelle K. Lee
*Director of the United States Patent and Trademark Office*